United States Patent
Sampayan

(10) Patent No.: US 10,333,010 B2
(45) Date of Patent: Jun. 25, 2019

(54) PHOTOCONDUCTIVE DEVICE WITH OPTICAL CONCENTRATOR

(71) Applicant: Lawrence Livermore National Security, LLC, Livermore, CA (US)

(72) Inventor: Stephen Sampayan, Manteca, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 222 days.

(21) Appl. No.: 15/488,058

(22) Filed: Apr. 14, 2017

(65) Prior Publication Data
US 2018/0302086 A1   Oct. 18, 2018

(51) Int. Cl.
| | |
|---|---|
| H03K 17/78 | (2006.01) |
| G02B 19/00 | (2006.01) |
| H01L 31/09 | (2006.01) |
| H01L 31/0232 | (2014.01) |
| G02B 3/00 | (2006.01) |
| G02B 6/42 | (2006.01) |

(52) U.S. Cl.
CPC ...... *H01L 31/0232* (2013.01); *G02B 19/0028* (2013.01); *G02B 19/0066* (2013.01); *H01L 31/09* (2013.01); *G02B 3/0006* (2013.01); *G02B 6/4295* (2013.01)

(58) Field of Classification Search
CPC . H01L 31/0232; H01L 31/09; G02B 19/0066; G02B 19/0028; G02B 6/4295; G02B 3/0006
USPC .................................................. 250/214 SW
See application file for complete search history.

(56) References Cited

U.S. PATENT DOCUMENTS

| | | | | |
|---|---|---|---|---|
| 5,369,283 | A | * | 11/1994 | Vogel ............... F02P 7/035 |
| | | | | 250/551 |
| 6,759,668 | B2 | * | 7/2004 | Matsuo ........... H01L 27/1443 |
| | | | | 250/214 SW |
| 8,563,930 | B2 | | 10/2013 | Harris et al. |
| 8,655,125 | B2 | | 2/2014 | Sullivan et al. |
| 2003/0184328 | A1 | | 10/2003 | Lee et al. |
| 2011/0142394 | A1 | | 6/2011 | Sun et al. |
| 2011/0297229 | A1 | | 12/2011 | Gu et al. |

(Continued)

FOREIGN PATENT DOCUMENTS

WO   2012006119 A2   1/2012

OTHER PUBLICATIONS

International Search Report and Written Opinion for International Application No. PCT/US2018/027724; dated Jul. 27, 2018; 13 pages.

*Primary Examiner* — Seung C Sohn
(74) *Attorney, Agent, or Firm* — Perkins Coie LLP

(57) ABSTRACT

A photonic device having wide bandgap (WBG) materials which change electrical behaviors in response to low-intensity light is disclosed. The device comprises an optical waveguide located in an optical path of light to receive the light and to spatially confine the received light as guided light at a higher optical intensity than the received light; a wide bandgap (WBG) material located in an optical path of the guided light output by the optical waveguide; and two electrodes formed at two different locations on the WBG material to provide two electrical contacts of an electrical path within the WBG material, wherein the WBG material exhibits an electrical conductivity that varies with a level of the guided light output by the optical waveguide to turn on or off the electrical path between the two electrodes.

25 Claims, 8 Drawing Sheets

(56) References Cited

U.S. PATENT DOCUMENTS

2013/0342306 A1  12/2013  Sampayan
2015/0187470 A1   7/2015  Sampayan et al.

* cited by examiner

PHOTOCONDUCTIVE DEVICE WITH OPTICAL CONCENTRATOR

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to photoconductive devices having both a Wide bandgap semiconductor (WBS) material and a radiation source.

BACKGROUND

Electronic circuits in most applications are based on electronic circuit elements, such as resistors, capacitors, inductors, transistors, diodes and other circuit modules including amplifiers, oscillators, and switches that are based on the above circuit elements. Such circuits can be implemented in various configurations and can be used in various applications. For example, with the ever growing need for compact telecommunication equipment, there is a growing demand for efficient ways in which receiver and transmitter functions can be implemented. Wide bandgap (WGB) materials, when illuminated or energized by a radiation source of photons or subatomic particles, renders the material conductive. They can be used to construct photoconductive switches that can promises switching performance beyond the existing semiconductor switches.

SUMMARY

The circuits and devices described in this patent document include photonic devices having wide bandgap (WGB) materials which change electrical behaviors in response to low-intensity light. The low-intensity light incident to the wide bandgap material is controlled or modulated and then concentrated in operations of various circuits and devices disclosed for effectuating various circuit functions.

In one exemplary aspect, a switch device is disclosed. The switch device comprises an optical waveguide located in an optical path of light to receive the light and to spatially confine the received light as guided light at a higher optical intensity than the received light; a wide bandgap (WBG) material located in an optical path of the guided light output by the optical waveguide; and two electrodes formed at two different locations on the WBG material to provide two electrical contacts of an electrical path within the WBG material, wherein the WBG material exhibits an electrical conductivity that varies with a level of the guided light output by the optical waveguide to turn on or off the electrical path between the two electrodes In another aspect, a switch device is provided to include an optical concentrator placed in an optical path of light to receive the light and to produce output light with a higher optical intensity; an optical waveguide located to receive the output light from the optical concentrator to spatially confine the received light as guided light at a higher optical intensity than the received light; a wide bandgap (WBG) material located in an optical path of the guided light output by the optical waveguide, wherein the WBG material exhibits an electrical conductivity that varies with a level of the guided light output present in the WBG material; and a circuit coupled to the WBG material and including an electrical path through the WBG material which is switched on or off by controlling the light.

In yet another aspect, a method is provided to include supplying a current to an electrical circuit that is coupled to two electrodes, wherein the two electrodes form at two different locations on a WGB material to provide two electrical contacts of an electrical path within the WBG material; providing light from a light source, wherein the light from the light source is directed to an optical waveguide that receives the light and spatially confines the received light as guide light at a higher optical intensity than the received light; operating the light source so that the WBG material exhibits an electrical conductivity that varies with a level of the guided light output by the optical waveguide to turn on or off the electrical path between the two electrodes.

Those and other aspects and their implementations are described in greater detail in the drawings, the description and the claims.

DETAILED DESCRIPTION

Wide bandgap (WBG) materials are materials that, when illuminated, irradiated, or otherwise energized by a radiation source of photons or subatomic particles, can change its electrical conductivity due to generation of charge carriers by optical absorption and may therefore be used, for example, in a photoconductive switch. Exemplary configurations of a photoconductive switch are described in U.S. Pat. Nos. 8,563,930 and 8,655,125, which are hereby incorporated by reference as part of the disclosure of this document. Examples of WGB semiconductor materials include silicon carbine (SiC) or gallium nitride (GaN).

Figure 1A:
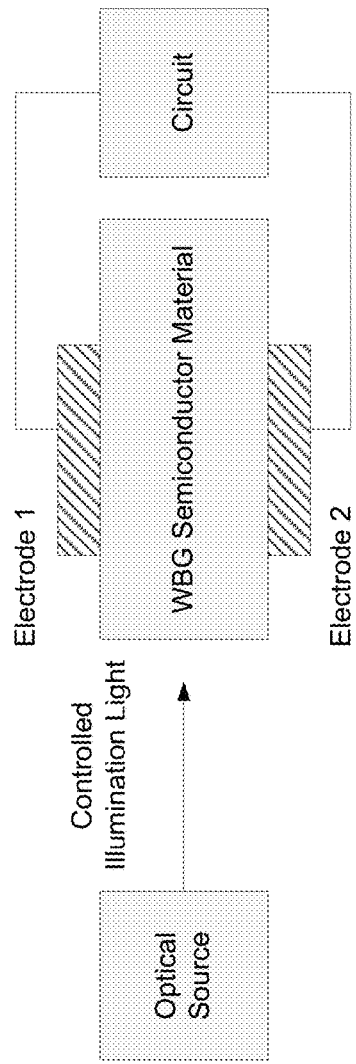
FIGS. 1A and 1B show an example of a WBG photoconductive switch circuit and examples of the switching operations at using optical control.

Referring to FIG. 1A, a photoconductive switch circuit can be constructed by using a WBG material, two electrodes formed at two different locations (e.g., on different facets or two different locations on the same facet) on the WBG material and coupled to a circuit, and an optical source that produces illumination light on the WBG material. Without optical energy injection, the WGB material exhibits a large resistance value (much larger than the circuit impedance). When optical energy is injected and absorbed in the WGB material, the WBG material absorbs light to become photoconductive with a drop in its resistance (much less than the circuit impedance). The optical source can be controlled to control the intensity or power of the illumination light which in turn controls the level of photoconductivity in the WBG material. Therefore, the photoconductive switch is essentially an optically controlled resistance. Pulsed lasers or other modulated optical sources can be used to generate short optical pulses to produce switching operations at varying switching times. Such a switch circuit can be used as an opticondistor that exhibits different electrical conductivity levels under different optical illumination conditions or a transconductance varistor when a voltage is applied to control or vary the level of the optical illumination at the WBG material.

The inherent properties of WBG materials make the WBG switch technology suitable for use in an accelerator system. In these switch geometries, having a flexible means for applying the light was necessary. For example, standard flexible fiber guides have been used in conjunction with extremely high peak power lasers as part of the integration. Typically, the lasers used could only deliver pulses from 5-40 ns, but at very high peak powers of 50 MW or more. In some embodiments, this laser intensity is high enough ($10^6$-$10^8$ W/cm$^2$) to render the WBG material sufficiently conductive so as to initiate a switching action. However, these lasers are very complex and costly; their cost ranges typically from $100 k to over $1 M.

Figure 1B:
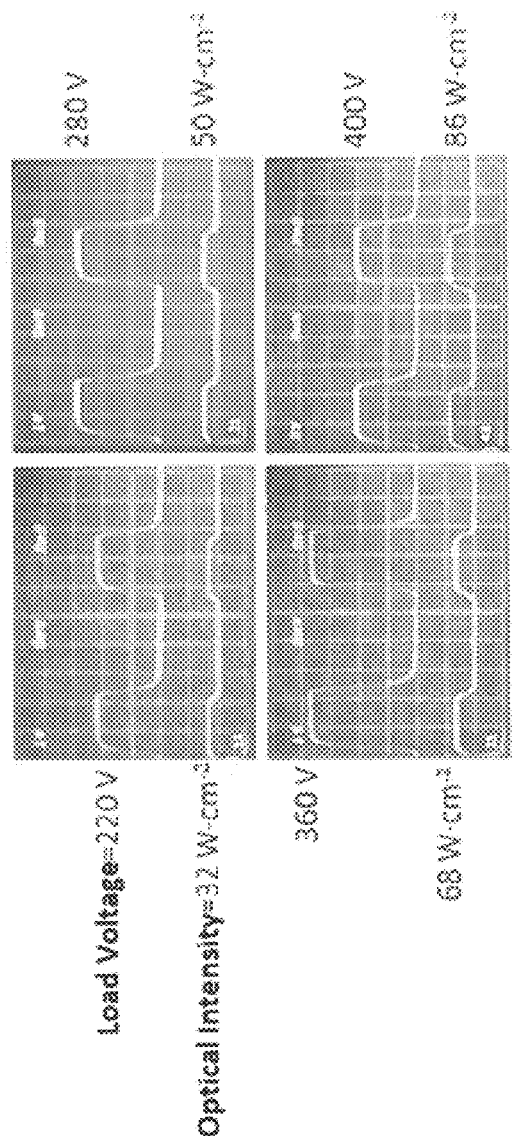

Properly doped WBG materials can be used to switch much longer pulses ranging from 10s of microseconds to an indefinite time on state, as shown in FIG. 1B. Therefore, it is possible and necessary to develop a means to concentrate relatively weak light sources for more commercially oriented uses such as power switching below 1 MHz. For instance, a blue LED is an ideal and inexpensive light source, but its intensity is only about 50 W/cm$^2$. To use such a light source in the switch geometry, the LED intensity would have to be increased by $2 \times 10^4$. Although standard lenses may be able to partially provide that increase in intensity, more innovative techniques are required.

This patent document discloses circuits, devices, systems, and methods using WBG materials modulated by applying low intensity light sources. The disclosed technology can have significant applications in communications, telecommunications, telecommunications switching, and general analog electronics.

Control in traditional semiconductor devices relies on the junction of dissimilarly doped materials: the low current introduced between two junctions controls current through the device. In WBG semi-insulating materials, an analogous behavior occurs but without a control junction by varying the intensity of the incident light on the device. Unlike a junction, where the applied voltage modifies the potential function developed across the PN boundary, photo-induced conductivity in semi-insulating materials relies on the excitation of populated deep levels. Restoration to the semi-insulating state results from prompt carrier decay. The use of a PN junction to control current flow is limited because the majority of the potential is developed across a thin depletion region formed by neutralization of the free carriers highly local to the junction boundary.

Figure 2:
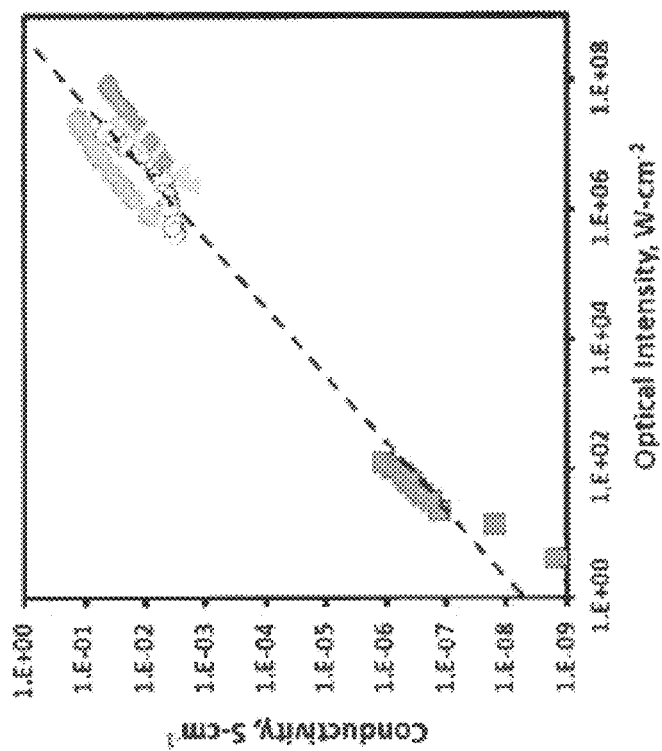
FIG. 2 demonstrates an exemplary optical current control range of semi-insulating SiC.

FIG. 2 demonstrate that, by varying the intensity of the photo-excitation of the bulk volume in 1-mm thick semi-insulating SiC, predictable current control can be achieved by varying the bulk conductivity over a factor of $10^8$ combined, corresponding to a conductivity from $10^{-9}$-S-cm$^{-1}$ to approximately $5 \times 10^{-1}$-S-cm$^{-1}$ for a variation of optical intensity from approximately 1-W-cm$^{-2}$ to $<10^8$ W-cm$^{-2}$. The excitation at the lower intensity levels is a continuous 445-nm LD. At the higher intensity level, it was a 7-10-ns pulsed beam at 532-nm from a frequency doubled Nd:YAG laser. The efficiency of this process is dependent on wavelength and increases as the excitation nears the equivalent bandgap energy of the material.

The favorable region to operate the device is from $10^6$ W-cm$^{-2}$ to $10^8$ W-cm$^{-2}$. Such intensities require complex and expensive optical systems. Often times, high intensity lasers are required making such a device even more cost prohibitive. For a 30 kV, 150 μm thick device, the illumination required would be 1500 W on the optical face of the SiC to achieve the required device conductivity. This level of illumination is clearly significant, but is consistent with already demonstrated technologies used for fiber or end pump laser systems. For instance Oclaro, Inc. announced a highly compact module of 80 W into a 105 μm fiber. The calculated intensity is about $10^6$ W-cm$^{-2}$.

Superluminescent LEDs (SLEDs) may be considered as an alternative optical source, but the devices are new and costs are comparable to laser diodes (LDs). Blue LEDs are also a potential option. Blue LEDs can reduce the optical pump cost by about a factor of ten over LDs. Intensity of blue LEDs, however, is multiple orders of magnitude lower as compared to LDs and will require an increase in intensity of about $2 \times 10^4$ to achieve the required conductivity in the device.

Figure 3:
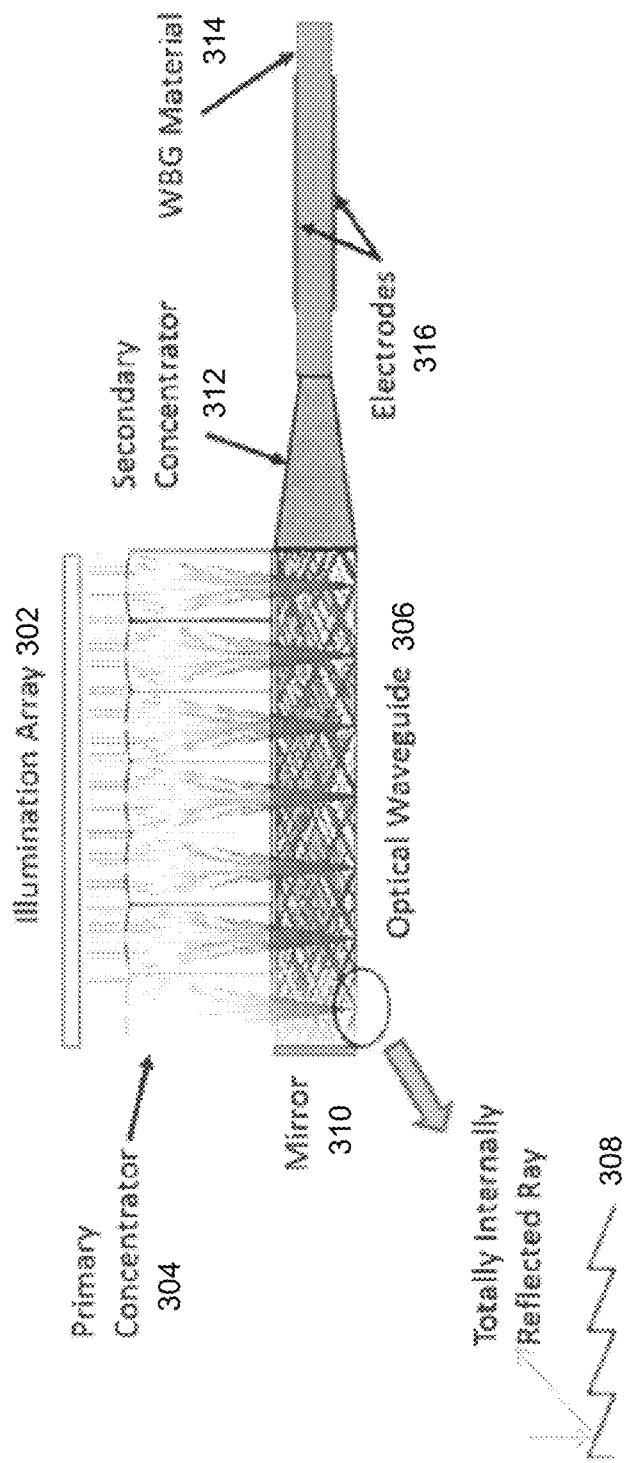
FIG. 3 shows an exemplary configuration of opticondistor using lower intensity light sources.

FIG. 3 shows an exemplary embodiment to concentrate the low-intensity light before directing it to the WBG material. In this particular embodiment, an illumination array 302 provides the input light source. An array of lenslets, acting as the primary concentrator 304, is formed on a transparent sheet that overlays an optical waveguide 306. The optical waveguide's opposite face has angled micro facets 308 (e.g. prisms) that are compact and confined to the focal spot of the waveguide. The angled micro facets direct the incoming light so that the incoming light changes angle sufficiently to undergo total internal reflection. The light that does not undergo total internal reflection may come out of the waveguide, therefore, tuning the waveguide is essential to ensure that most of the incoming light can be directed to the optional secondary concentrator 312 and the switch 316. It has been calculated that 900 times increase in light concentration is possible, but the degree of concentration is dependent on many factors, including the dimensions of the optical waveguide, f-number, and entrance angle variation.

Another embodiment requires a mirror 310 on the opposite end of the waveguide to ensure all rays are properly directed to the switch. If 900 times gain in concentration is achieved, the system would also need a secondary concentrator 312 for another 20-30 times gain in intensity prior to the WBG material face. This amount of geometric gain can be realized with a combination of concentrator prisms and standard lenses. In some embodiments, the secondary concentrator is a waveguide with a tapered profile. In some embodiments, the secondary concentrator includes a series of properly designed lenses. In some embodiment, a tapered waveguide and free-space optical instruments (e.g. specially-formed lenses with proper widths) can be combined to construct the secondary concentrator. The concentrated light is then directed to the switch, where the WBG material 314 is placed between two electrodes 316.

In some embodiments, a curved array of LEDs with convergent similar lenslets is used. The curvature would take spherical aberrations into account to ensure that each LED element is focused at the same point. Both the focal length of the curvature and the focal length of the lenslets would be equal so that the combined effects would concentrate all the light onto the switch facet. In some embodiments, a planar varying index gradient optical system can be used to replace or modify the primary light concentrator. With such a system, the complexity of the prism array can be eliminated.

To make use of a lower intensity light source, it is necessary to structure the WGB material to fully exploit its inherent properties. The goal is to achieve high conductivity with as little incoming light as possible. As illustrated by FIG. 2, the conductivity improves as optical intensity increases. Given a certain amount of incoming light, if the light is limited to a very small point, the optical intensity rises, leading to better conductivity. Admitting the light axially and using 1 $cm^2$ area by 1 mm thick samples for a 30 kV device, therefore, is grossly inefficient. This inefficiency results from the absorption coefficient for blue light in SiC, which is typically less than 1 $cm^{-1}$. Most of the light that travels axially through the 1 mm device is unused. Stacking switches axially is possible, but attempting to engineer the exiting light from the first switch to maintain careful collimation into the next switch is very difficult. A better solution is to illuminate the switch as small of a facet as possible. In some embodiments, using a thinner substrate and illuminating on a facet rather than a face can lower the total peak power required by 5 to 10 times.

Figure 4A:
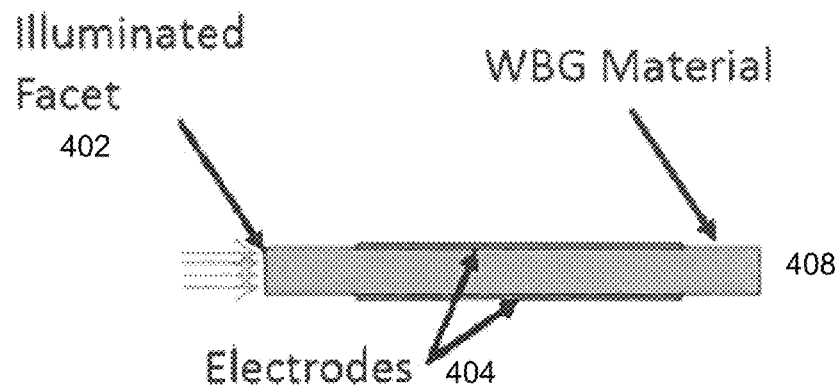
FIG. 4A shows an exemplary configuration of the WBG material.
Figure 4B:
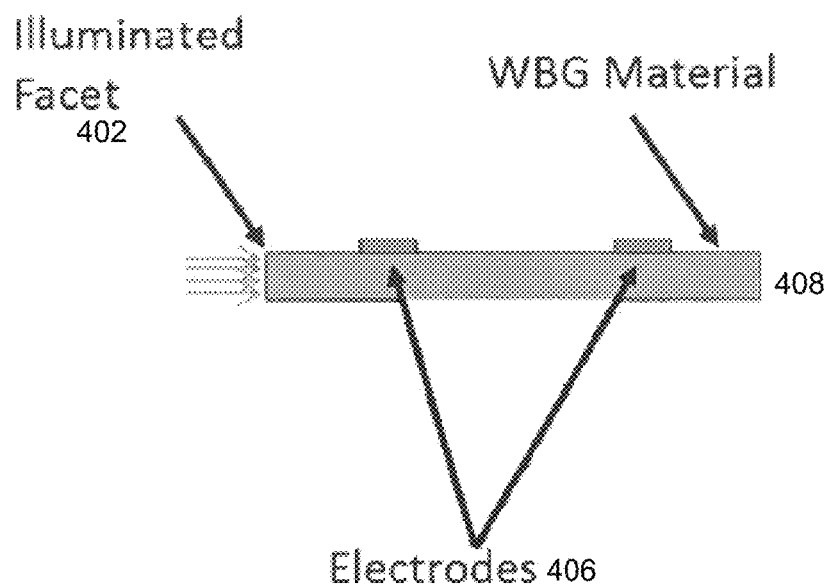
FIG. 4B shows another exemplary configuration of the WBG material.

SiC can withstand several megavolts per millimeter and allow a typical 30 kV device to be as thin as 200 microns. In some embodiments, the 30 KV device has a thickness of around 400 microns. Since it is the intensity that governs the conductance and therefore the ultimate resistance of the device, the key is to reduce the illuminated facet area while maximizing the volume that absorbs the light. One efficient embodiment of such WGB configuration would be using rectangular or similar prism shapes for the facet area, as shown in FIG. 4A and FIG. 4B. For a vertical configuration having electrodes 404 on opposite sides of the WGB material 408, as shown in FIG. 4A, the dimension parallel to the incident light can be on the order of the reciprocal of the absorption coefficient, but a reflector on the opposite face can minimize that dimension. The height of the illuminated facet 402 should be as thin as possible and approximately equal to the desired operating voltage of the device, with a designed factor of safety, divided by the material breakdown field. Similarly, the width of the facet should be based on the designed current, with a designed factor of safety, of the device times the reciprocal of the absorption coefficient and divided by the maximum current density capability of the material. Multiple other geometries using the same design can be used in other embodiments. For example, FIG. 4B shows a lateral configuration with electrodes 406 located on the same side of the WGB material 408 to allow the remaining of circuitry connections to be on the same side.

In some embodiments, the idea of optical resonator can be leveraged. Reflective coatings, such as dielectric coatings, can be applied on other facets of the WGB material to increase reflection of the light within the WGB material, hence increasing the light intensity and reducing the resistance.

Figure 5:
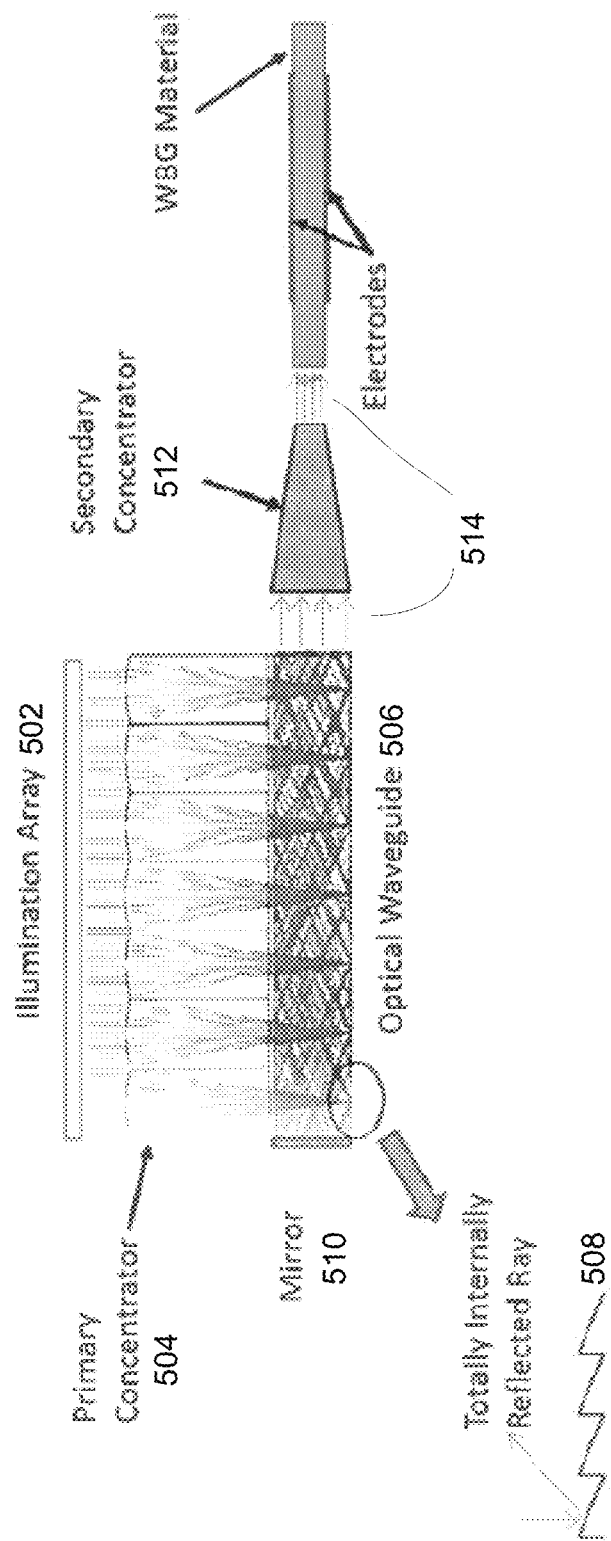
FIG. 5 shows another exemplary configuration of opticondistor using low intensity light sources.

It is noteworthy that the WGB material does not have to be adjacent to the light source. As shown in FIG. 5, there can be fabrication and/or end use instances, such as high voltage stand-off, where air space or some free propagation distance 514 is needed between each identified element. These spaces may be supplemented with an added lens, fiber, waveguide, dielectric fluid, or similar element. In some embodiments, the interface between the secondary concentrator and the WBG material is critical to the configuration. Because the light has been highly concentrated at this interface, any optical loss due to different index of reflection is amplified. It is, therefore, important to select a high-quality index-matching material as a buffer material at this interface. In some embodiments, a multi-layer dielectric ante-reflective (AR) coating is used. In some embodiments, polyimide is used.

Figure 6:
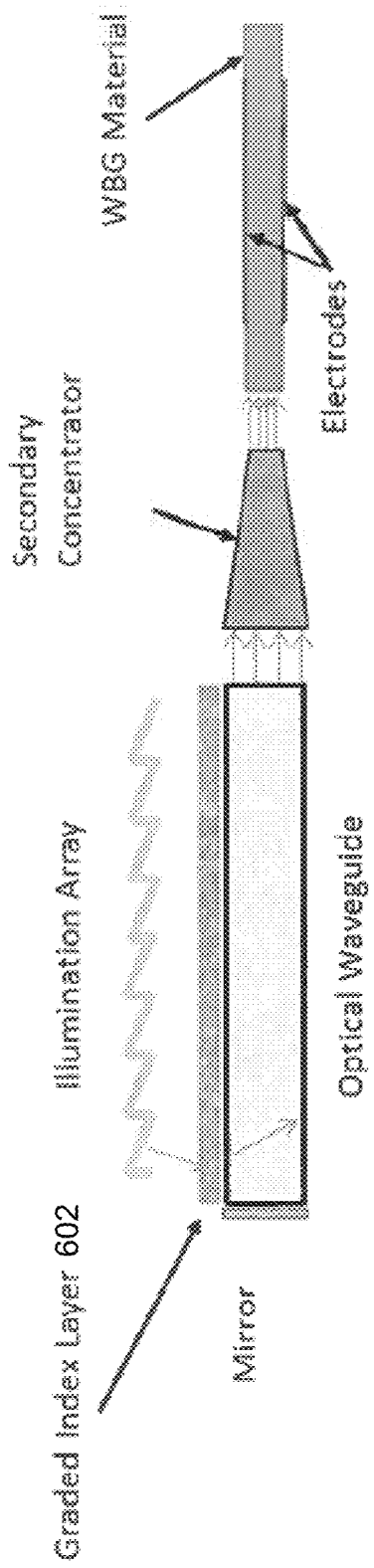
FIG. 6 shows an exemplary configuration of opticondistor using a graded index layer to concentrate low intensity light sources.

In some embodiments, illustrated in FIG. 6, the opposite face prism array can be replaced with or used in conjunction with a graded index material 602 on the initial concentrator face. In the particular embodiment shown in FIG. 6, the graded index material is graded in the direction of the normal of the surface. The graded material can also include multiple layers, each of which having a different index to cause the light rays to bend towards the center of the waveguide.

Figure 7:
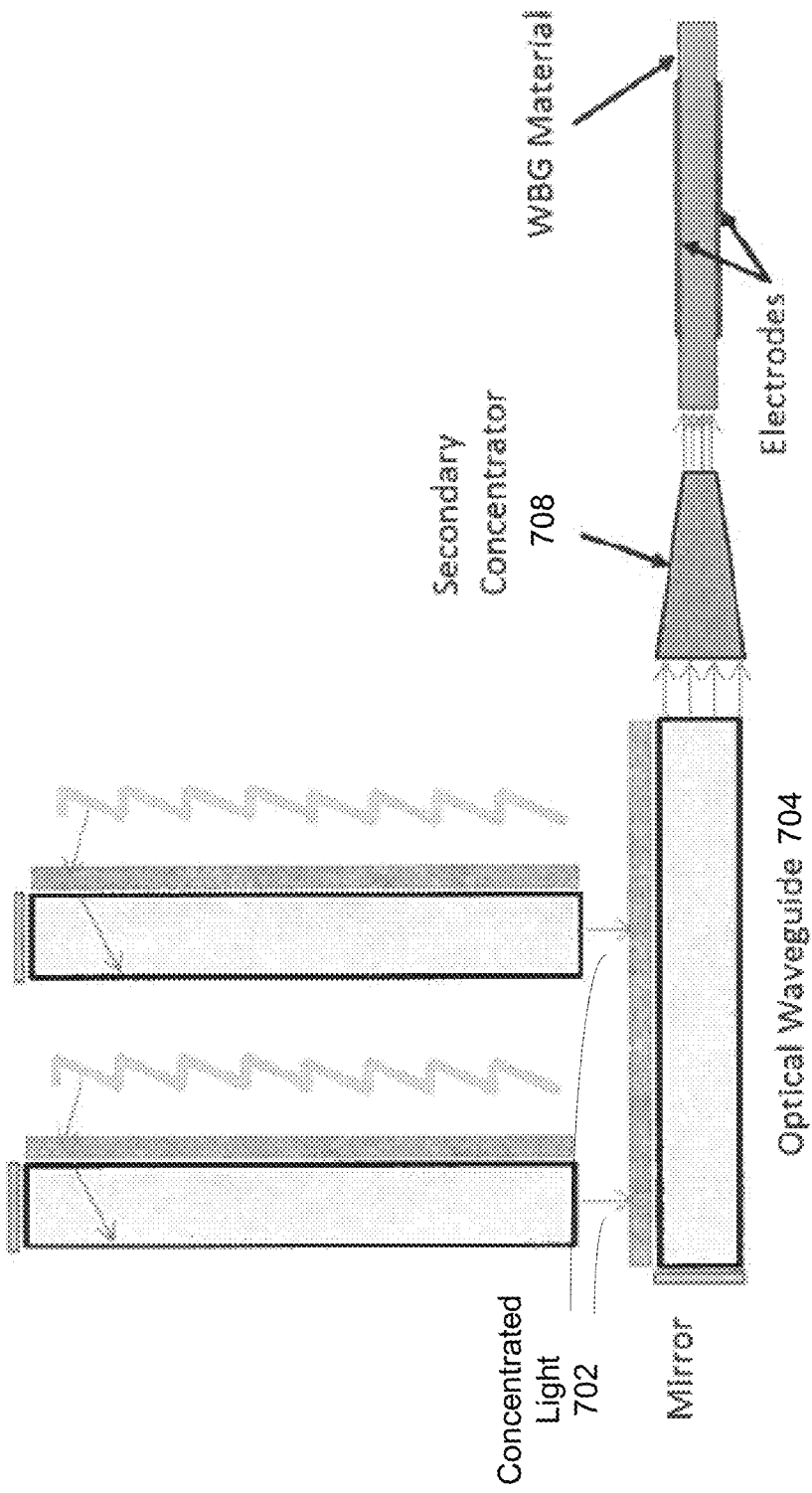
FIG. 7 an exemplary configuration of opticondistor configuration using a combination of techniques for concentrating low intensity light into the WBG material.

A combination of these techniques can also be used to achieve higher level of concentration of the incoming light. For example, as shown in FIG. 7, two concentrated light sources 702 are coupled to the optical waveguide 704. The concentrated and guided light is then fed through the secondary concentrator 708 again to operate the WBG switch.

Figure 8:
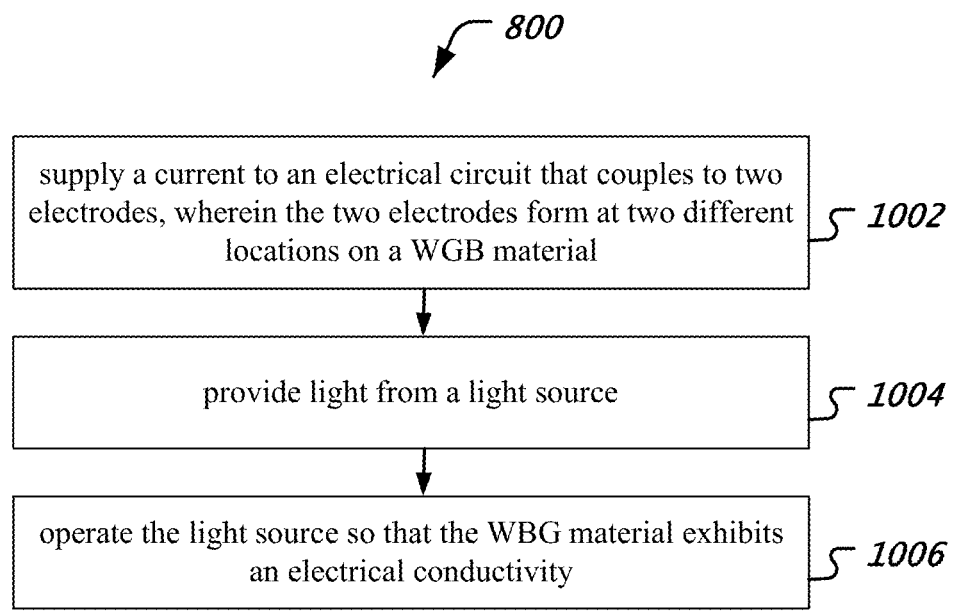
FIG. 8 shows an exemplary flow chart for a method for operating an opticondistor under low intensity light.

FIG. 8 shows an exemplary flow chart of a method 800 for operating a opticondistor under low intensity light. The method can be implemented using some of the configurations discussed above, such as the geometry shown in FIG. 3.

The method 800 includes, at 802, supplying a current to an electrical circuit that is coupled to two electrodes, wherein the two electrodes form at two different locations on a WGB material to provide two electrical contacts of an electrical path within the WBG material.

The method 800 includes, at 804, providing light from a light source, wherein the light from the light source is directed to an optical waveguide that receives the light and spatially confine the received light as guide light at a higher optical intensity than the received light. In some embodiments, the light source comprises an array of light-emitting diodes (LEDs). In some embodiments, a mirror is attached to the optical waveguide to assist guiding the received light into the optical waveguide as the guided light.

The method 800 includes, at 806, operating the light source so that the WBG material exhibits an electrical conductivity that varies with a level of the guided light output by the optical waveguide to turn on or off the electrical path between the two electrodes. In some embodiments, an output optical concentrator is positioned between the optical waveguide and the WBG material in the optical path of the guided light output by the optical waveguide to further increase an optical intensity of the guided light from the optical waveguide when entering the WBG material.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A switch device, comprising:
   an optical waveguide located in an optical path of light to receive the light and to spatially confine the received light as guided light at a higher optical intensity than the received light;
   a wide bandgap (WBG) material located in an optical path of the guided light output by the optical waveguide; and
   two electrodes formed at two different locations on the WBG material to provide two electrical contacts of an electrical path within the WBG material, wherein the WBG material exhibits an electrical conductivity that varies with a level of the guided light output by the optical waveguide to turn on or off the electrical path between the two electrodes.

2. The device as in claim 1, wherein a mirror is attached to the optical waveguide to assist guiding the received light into the optical waveguide as the guided light.

3. The device as in claim 1, comprising:
   a plurality of angled micro facets over a facet of the optical waveguide to assist coupling the light into the optical waveguide as the guided light.

4. The device as in claim 3, comprising:
   an input optical concentrator located between an origin of the light and the optical waveguide to concentrate the light as input light to the optical waveguide and direct the concentrated light onto the plurality of angled micro facets for total internal reflection in the optical waveguide.

5. The device as in claim 4, wherein the input optical concentrator comprises an array of lenslets.

6. The device as in claim 4, wherein the input optical concentrator comprises a planar varying index gradient optical system.

7. The device as in claim 4, comprising:
   an output optical concentrator located between the optical waveguide and the WBG material in the optical path of the guided light output by the optical waveguide to further increase an optical intensity of the guided light from the optical waveguide when entering the WBG material.

8. The device as in claim 7, wherein the output optical concentrator comprises a second optical waveguide to further increase an optical intensity of the light entering the WBG material.

9. The device as in claim 7, wherein the output optical concentrator includes a plurality of optical lenses to further increase an optical intensity of the guided light entering the WBG material.

10. The device as in claim 7, further comprising:
    a high-index material between the optical waveguide and the output optical concentrator.

11. The device as in claim 7, further comprising:
    an index-matching material between the output optical concentrator and the WBG material.

12. The device as in claim 1, further comprising a light source to produce the light.

13. The device as in claim 12, wherein the light source comprises laser diodes or an array of light-emitting diodes (LEDs).

14. The device as in claim 12, wherein the light source comprises a curved array of LEDs, wherein the curvature of the curved array of LEDs and the array of lenslets have equal focal lengths.

15. The device as in claim 12, where in the light source further comprises:
    an illumination array to produce light; and
    an optical waveguide located in an optical path of the light from the illumination array to receive the light and to spatially confine the received light as guided light at a higher optical intensity than the received light.

16. The device of claim 1, wherein the WBG material includes an optical input facet to receive the illumination light and other facets that are coated with reflective coatings.

17. A switch device, comprising:
    an optical concentrator placed in an optical path of light to receive the light and to produce output light with a higher optical intensity;
    an optical waveguide located to receive the output light from the optical concentrator to spatially confine the received light as guided light at a higher optical intensity than the received light;
    a wide bandgap (WBG) material located in an optical path of the guided light output by the optical waveguide, wherein the WBG material exhibits an electrical conductivity that varies with a level of the guided light present in the WBG material; and
    a circuit coupled to the WBG material and including an electrical path through the WBG material which is switched on or off by controlling the light.

18. The device as in claim 17, wherein a mirror is attached to the optical waveguide to assist guiding the received light into the optical waveguide as the guided light.

19. The device as in claim 17, comprising:
    a plurality of angled micro facets over a facet of the optical waveguide to assist coupling the light from an illumination array into the optical waveguide as the guided light.

20. The device as in claim 17, wherein the optical concentrator includes a lens array.

21. The device as in claim 17, further comprising a second optical concentrator located in an optical path between the optical waveguide and the WBG material to further increase an optical intensity of the guided light that enters the WBG material.

22. The device as in claim 17, further comprising an array of light sources to produce the light.

23. A method for switching on or off an electrical path, comprising:
    supplying a current to an electrical circuit that is coupled to two electrodes, wherein the two electrodes are formed at two different locations on a WGB material to provide two electrical contacts of an electrical path within the WBG material;

directing light from a light source into an optical waveguide that spatially confines the received light as guide light at a higher optical intensity than the received light; and operating the light source so that the WBG material exhibits an electrical conductivity that varies with a level of the guided light output by the optical waveguide to turn on or off the electrical path between the two electrodes.

24. The method as in claim 23, comprising spatially concentrating the light from the light source to achieve a higher optical intensity when coupling the light into the optical waveguide.

25. The method as in claim 24, further comprising spatially concentrating the light from the optical waveguide to achieve a higher optical intensity when coupling the light into the WBG material.

* * * * *